United States Patent
Hung et al.

(10) Patent No.: US 10,559,534 B2
(45) Date of Patent: Feb. 11, 2020

(54) CIRCUIT SUBSTRATE

(71) Applicants: Industrial Technology Research Institute, Hsinchu (TW); First Hi-tec Enterprise Co., Ltd., Taoyuan (TW); NEXCOM International Co., Ltd., New Taipei (TW)

(72) Inventors: Sheng-Che Hung, Changhua County (TW); Min-Lin Lee, Hsinchu (TW); Ching-Shan Chang, New Taipei (TW); Hung-I Liu, New Taipei (TW)

(73) Assignees: Industrial Technology Research Institute, Hsinchu (TW); First Hi-tec Enterprise Co., Ltd., Taoyuan (TW); NEXCOM International Co., Ltd., New Taipei (TW)

( * ) Notice: Subject to any disclaimer, the term of this patent is extended or adjusted under 35 U.S.C. 154(b) by 0 days.

(21) Appl. No.: 16/052,641

(22) Filed: Aug. 2, 2018

(65) Prior Publication Data

US 2019/0148300 A1 May 16, 2019

Related U.S. Application Data

(60) Provisional application No. 62/584,886, filed on Nov. 12, 2017.

(30) Foreign Application Priority Data

May 18, 2018 (TW) .............................. 107117075 A

(51) Int. Cl.
*H05K 1/18* (2006.01)
*H01L 23/538* (2006.01)
(Continued)

(52) U.S. Cl.
CPC .... *H01L 23/5383* (2013.01); *H01L 23/49827* (2013.01); *H01L 23/5226* (2013.01);
(Continued)

(58) Field of Classification Search
CPC .... H05K 1/0296; H05K 1/0298; H05K 1/112; H05K 1/113; H05K 1/114; H05K 1/115; H05K 1/185; H05K 1/11
See application file for complete search history.

(56) References Cited

U.S. PATENT DOCUMENTS 6,091,027 A 7/2000 Hesselbom et al.
7,679,006 B2 3/2010 Nakamura
(Continued)

FOREIGN PATENT DOCUMENTS

CN 106816676 6/2017
TW I248330 1/2006

*Primary Examiner* — Jae Lee
(74) *Attorney, Agent, or Firm* — JCIPRNET

(57) ABSTRACT

A circuit substrate includes a dielectric layer, a first conductive structure and a second conductive structure. The first conductive structure includes a first conductive circuit and a first conductive via. The first conductive circuit is disposed on the dielectric layer. The first conductive via is disposed in the dielectric layer, and the first conductive circuit is connected to the first conductive via. The second conductive structure includes a second conductive circuit and a second conductive via. The second conductive circuit is disposed in the dielectric layer, the second conductive circuit and the first conductive circuit of the first conductive structure are arranged with an interval, and the second conductive via surrounds the first conductive via with an interval. The second conductive structure has an extending portion. The extending portion protrudes toward the first conductive via and does not contact the first conductive via.

20 Claims, 5 Drawing Sheets

(51) Int. Cl.
*H01L 23/522* (2006.01)
*H01L 23/00* (2006.01)
*H05K 1/02* (2006.01)
*H01L 23/498* (2006.01)
*H05K 1/11* (2006.01)

(52) U.S. Cl.
CPC ........... *H01L 24/08* (2013.01); *H05K 1/0251* (2013.01); *H05K 1/116* (2013.01); *H05K 2201/0338* (2013.01); *H05K 2201/0352* (2013.01); *H05K 2201/0391* (2013.01); *H05K 2201/09254* (2013.01); *H05K 2201/09272* (2013.01); *H05K 2201/09463* (2013.01); *H05K 2201/09809* (2013.01)

(56) References Cited

U.S. PATENT DOCUMENTS

| | | | |
|---|---|---|---|
| 8,354,601 B2 | 1/2013 | Russell | |
| 9,706,656 B2 | 7/2017 | Hsu et al. | |
| 2004/0212971 A1* | 10/2004 | Iguchi | H05K 1/0222 361/780 |
| 2007/0193775 A1 | 8/2007 | Chen et al. | |

* cited by examiner

CIRCUIT SUBSTRATE

CROSS-REFERENCE TO RELATED APPLICATION

This application claims the priority benefits of U.S. provisional application Ser. No. 62/584,886, filed on Nov. 12, 2017 and Taiwan application serial no. 107117075, filed on May 18, 2018. The entirety of each of the above-mentioned patent applications is hereby incorporated by reference herein and made a part of this specification.

TECHNICAL FIELD

The disclosure relates to a circuit substrate and relates to a circuit substrate having conductive vias.

BACKGROUND

Currently, a multilayer substrate having at least two circuit layers is usually disposed with conductive vias for the circuit layers to be electrically connected with each other. Taking a circuit substrate disposed with conductive vias as an example, a conventional design manner may cause an issue of impedance mismatching. Specifically, as illustrated in FIG. 1, a conventional circuit substrate 50 disposed with conductive vias is provided, where a distance between an inner conductive via 52 and an outer conductive via 54 may be designed to be an adaptive value for impedance matching, and a distance between a signal circuit 56 and a grounding layer 58 may be designed to be an adaptive value for impedance matching. However, a corner portion 50a is provided at a junction of the inner conductive via 52 and the signal circuit 56, and a corner portion 50b is provided at a junction of the outer conductive via 54 and the grounding layer 58. In a condition where only the impedance matching between the inner conductive via 52 and the outer conductive via 54 and the impedance matching between the signal circuit 56 and the grounding layer 58 are considered, the phenomenon of impedance mismatching still exists between the corner portion 50a and the corner portion 50b.

SUMMARY

A circuit substrate introduced by the disclosure includes a dielectric layer, a first conductive structure and a second conductive structure. The first conductive structure includes a first conductive circuit and a first conductive via. The first conductive circuit is disposed on the dielectric layer. The first conductive via is disposed in the dielectric layer, and the first conductive circuit is connected to the first conductive via. The second conductive structure includes a second conductive circuit and a second conductive via. The second conductive circuit is disposed in the dielectric layer, the second conductive circuit and the first conductive circuit of the first conductive structure are arranged with an interval, and the second conductive via surrounds the first conductive via with an interval. The second conductive structure has an extending portion. The extending portion protrudes toward the first conductive via and does not contact the first conductive via.

Another embodiment of a circuit substrate introduced by the disclosure includes a dielectric layer, a first conductive structure and a second conductive structure. The first conductive structure includes a first conductive circuit and a first conductive via. The first conductive circuit is disposed on the dielectric layer. The first conductive via is disposed in the dielectric layer, and the first conductive circuit is connected to the first conductive via. The second conductive structure includes a second conductive circuit and a second conductive via. The second conductive circuit is disposed in the dielectric layer, the second conductive circuit and the first conductive circuit of the first conductive structure are arranged with an interval, and the second conductive via surrounds the first conductive via with an interval. The second conductive structure has an opening portion, and an opening direction of the opening portion is far away from the first conductive via.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
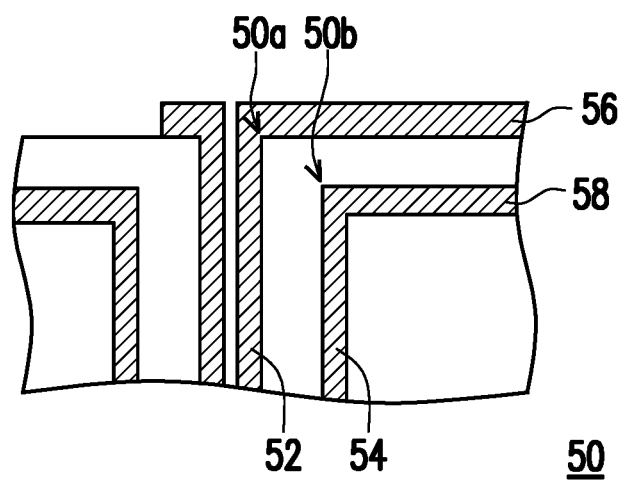
FIG. 1 is a schematic cross-sectional view illustrating a conventional circuit substrate.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
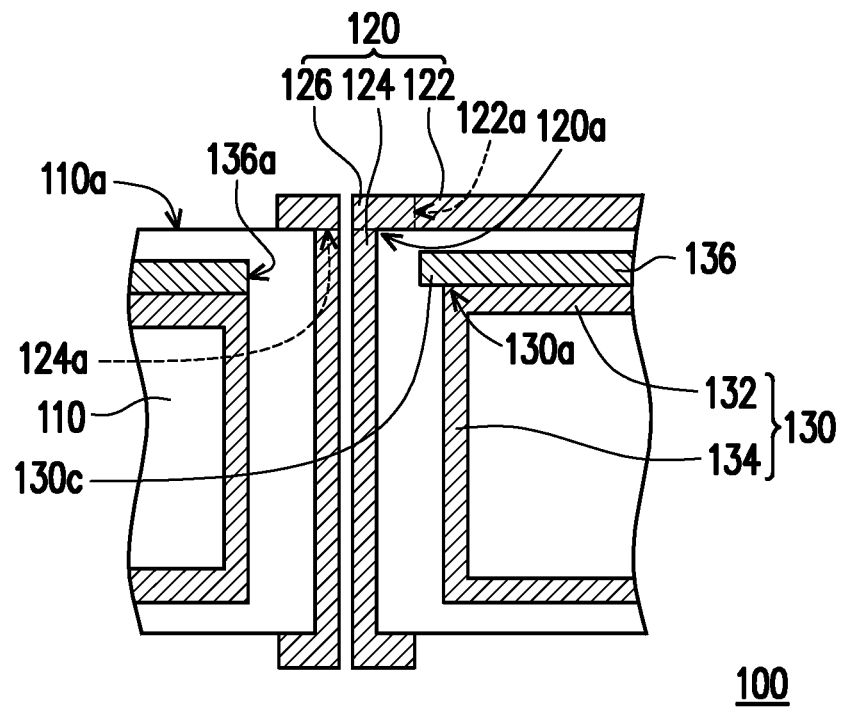
FIG. 2A is a schematic cross-sectional view illustrating a circuit substrate according to an embodiment of the disclosure.
Figure 3:
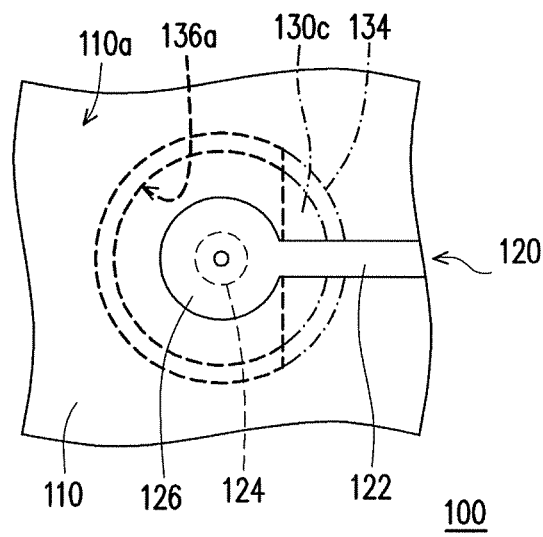
FIG. 3 is a schematic top view illustrating the circuit substrate depicted in FIG. 2A.

FIG. 2A is a schematic cross-sectional view illustrating a circuit substrate according to an embodiment of the disclosure. FIG. 3 is a schematic top view illustrating the circuit substrate depicted in FIG. 2A. Referring to FIG. 2A and FIG. 3, a circuit substrate 100 of the embodiment includes a dielectric layer 110, a first conductive structure 120 and a second conductive structure 130. The first conductive structure 120 includes a first conductive circuit 122, a first conductive via 124 and a pad 126. The first conductive circuit 122 is disposed on a surface 110a of the dielectric layer 110, the first conductive via 124 is disposed in the dielectric layer 110, and the pad 126 is disposed on the surface 110a of the dielectric layer 110 and covers a connection portion 124a of the first conductive via 124. The connection portion 124a is, for example, a top of the first conductive via 124. A connection portion 122a of the first conductive circuit 122 is connected to the connection portion 124a of the first conductive via 124 through the pad 126. The connection portion 122a is, for example, an end of the first conductive circuit 122 which is adjacent to the pad 126. The first conductive structure 120 has a first corner portion 120a, and the first corner portion 120a is formed at a junction of the first conductive circuit 122 and the first conductive via 124, i.e., a location of the connection portion 124a of the first conductive via 124.

Figure 2B:
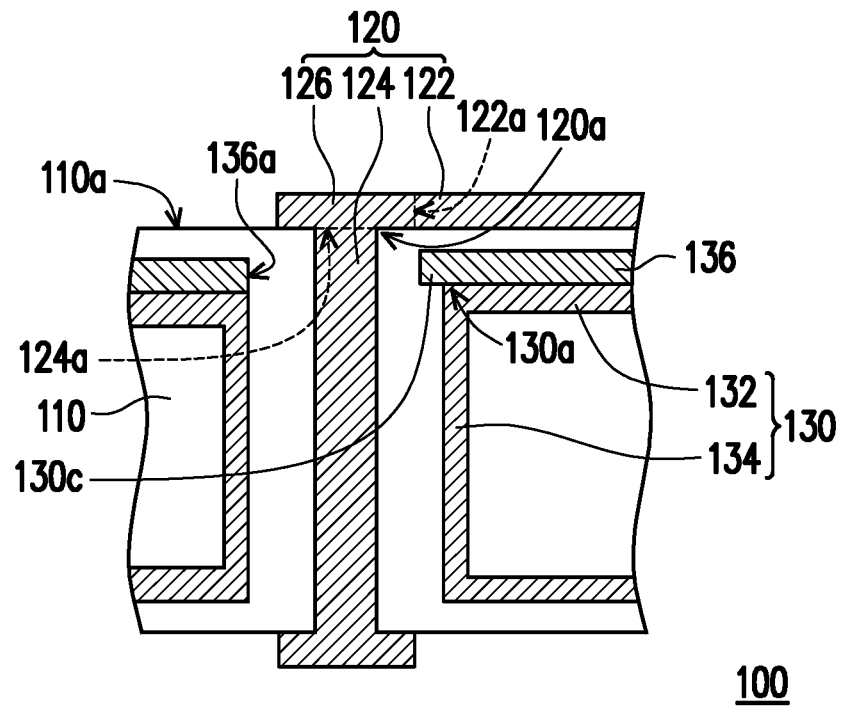
FIG. 2B is a schematic cross-sectional view illustrating a circuit substrate according to another embodiment of the disclosure.

In the present embodiment, the dielectric layer 110 is, for example, a composite layer including at least one dielectric material layer, but the disclosure is not limited thereto. In the present embodiment, the first conductive via 124 is, for example, a conductive via structure passing through the entire circuit substrate 100, while in another embodiment, the first conductive via 124 may also be a conductive via structure disposed in the entire circuit substrate 100, but the disclosure is not limited thereto. Additionally, in the present embodiment, the first conductive via 124 is non-solid, while in another embodiment (as illustrated in FIG. 2B), the first conductive via 124 may be solid, but the disclosure is not limited thereto.

The second conductive structure 130 includes a second conductive circuit 132 and a second conductive via 134. The second conductive circuit 132 is disposed in the dielectric layer 110, the second conductive circuit 132 and the first conductive circuit 122 are arranged with an interval, and the second conductive via 134 surrounds the first conductive via 124 with an interval. The second conductive structure 130 has a second corner portion 130a, and the second corner portion 130a is formed at a junction of the second conductive circuit 132 and the second conductive via 134.

In the present embodiment, the first conductive circuit 122 is, for example, a signal circuit, and the first conductive via 124 is, for example, a signal via, but the disclosure is not limited thereto. Additionally, the second conductive structure 130 of the present embodiment is, for example, a shielding structure or may be, for example, a grounding structure, but the disclosure is not limited thereto. The first conductive via 124 and the second conductive via 134, for example, jointly form a conductive via structure, for example, a coaxial via structure which may be in a form of a through hole, a buried hole or a blind hole, but the disclosure is not limited thereto. In other embodiments, the first conductive structure 120 and the second conductive structure 130 may be conductive structures having other properties, for example, a non-conductive via structure or a structure that multiple first conductive vias are disposed in at least one second conductive via, but the disclosure is not limited thereto.

The second conductive structure 130 of the present embodiment includes an extending portion 130c located directly below the first conductive circuit 122. The extending portion 130c protrudes toward the first conductive via 124 and does not contact the first conductive via 124. In this way, the extending portion 130c and the first conductive circuit 122 are located at the same side of the first conductive via 124, the extending portion 130c is located between the connection portion 124a of the first conductive via 124 and the second conductive structure 130, and the extending portion 130c does not overlap the second conductive circuit 132 and extends from the second corner portion 130a to the first corner portion 120a, such that a distance between the first corner portion 120a and the extending portion 130c is smaller than a distance between the first corner portion 120a and the second corner portion 130a. Thereby, the extending portion 130c may be considered as an extending structure of a bending portion (i.e., the aforementioned second corner portion 130a) of the second conductive structure 130, and the distance between the bending portion of the second conductive structure 130 and a bending portion (i.e., the aforementioned first corner portion 120a) of the first conductive structure 120 may be adjusted by using the extending portion 130c for adaptive impedance control at the bending portions, so as to provide the circuit substrate 100 with enhance impedance matching.

A size and a shape of the extending portion 130c are schematically illustrated in FIG. 2A and FIG. 3, and a design manner of the extending portion 130c is not limited. In other embodiments, the extending portion 130c may be designed in another adaptive size and shape which correspond to the bending portion of the first conductive structure 120, such that the distance between the bending portion (i.e., the aforementioned second corner portion 130a) of the second conductive structure 130 and the bending portion (i.e., the aforementioned first corner portion 120a) of the first conductive structure 120 may be adjusted in the same way as described above.

In the present embodiment, the second conductive structure 130 includes a conductive layer 136, the conductive layer 136 is located on the second conductive circuit 132, and the extending portion 130c extends from the conductive layer 136. Additionally, the conductive layer 136 of the present embodiment, for example, completely covers the second conductive circuit 132, but the disclosure is not limited thereto, and the conductive layer 136 may cover a part of the second conductive circuit 132.

In particular, in the present embodiment, the conductive layer 136 has an opening 136a corresponding to the second conductive via 134, and the extending portion 130c is formed in the opening 136a. An orthographic projection of the extending portion 130c on the surface 110a of the dielectric layer 110 at least partially overlaps the first conductive circuit 122, such that the extending portion 130c may correspond to the bending portion between the first conductive circuit 122 and the first conductive via 124.

In the present embodiment, the second conductive circuit 132 and the conductive layer 136 may be made of the same material, for example, copper. However, the disclosure is not limited thereto, and in other embodiments, the second conductive circuit 132 and the conductive layer 136 may be respectively made of other suitable same conductive material or different conductive materials.

Figure 4:
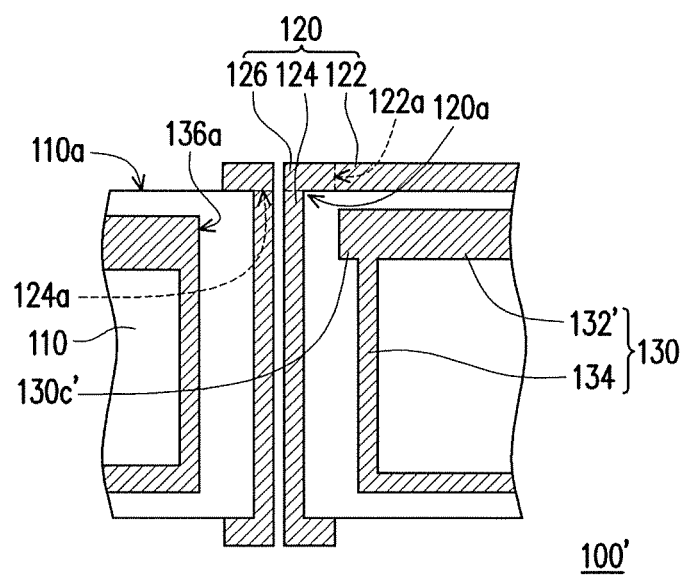
FIG. 4 is a schematic cross-sectional view illustrating a circuit substrate according to another embodiment of the disclosure.

In the present embodiment, for example, the second conductive circuit 132 is first formed, and the conductive layer 136 is then formed on the second conductive circuit 132. Namely, the second conductive circuit 132 and the conductive layer 136 may be non-integrally formed. However, the disclosure is not limited thereto, and embodiments will be provided as examples with reference to drawings for description below. FIG. 4 is a schematic cross-sectional view illustrating a circuit substrate according to another embodiment of the disclosure. A second conductive circuit 132' of a circuit substrate 100' illustrated in FIG. 4 is a conductive layer, and an extending portion 130c' extends from the conductive layer.

The pad 126 of the present embodiment does not overlap the orthographic projection of the extending portion 130c of the second conductive structure 130 on the surface 110a of the dielectric layer 110. Namely, in the present embodiment, the extending portion 130c is not located directly below the pad 126, thereby preventing unexpected electrical connection from occurring between the pad 126 and the extending portion 130c due to a manufacturing error, but the disclosure is not limited thereto.

Figure 5:
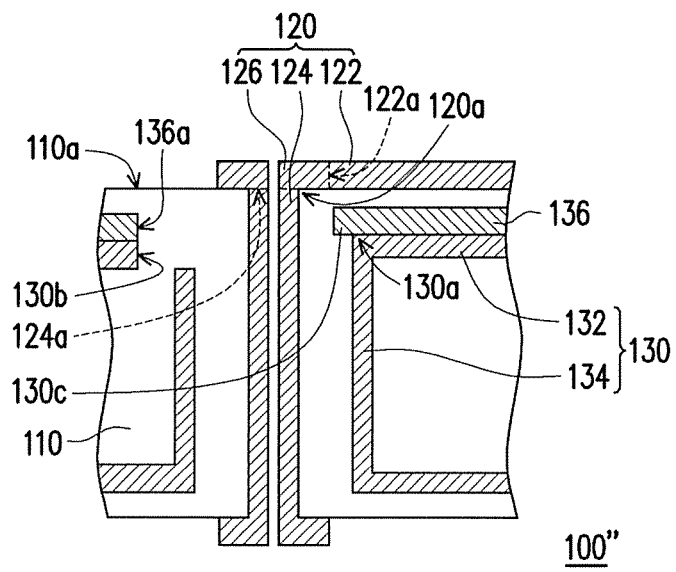
FIG. 5 is a schematic cross-sectional view illustrating a circuit substrate according to another embodiment of the disclosure.
Figure 6:
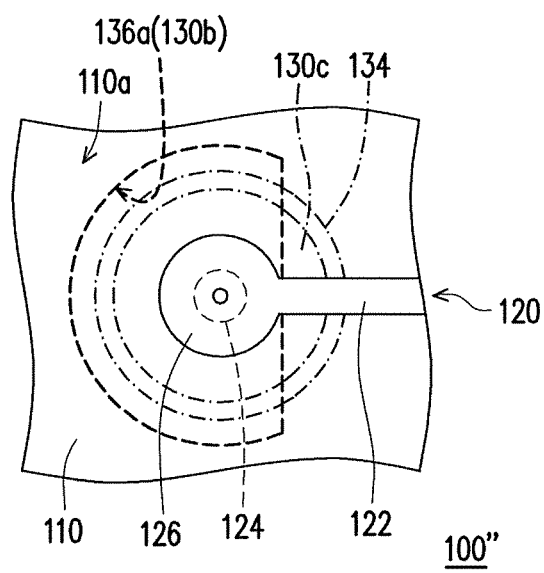
FIG. 6 is a schematic top view illustrating the circuit substrate depicted in FIG. 5.

FIG. 5 is a schematic cross-sectional view illustrating a circuit substrate according to another embodiment of the disclosure. FIG. 6 is a schematic top view illustrating the circuit substrate depicted in FIG. 5. The second conductive structure 130 of a circuit substrate 100'' illustrated in FIG. 5 and FIG. 6 has an opening portion 130b filled with the dielectric layer 110, the opening portion 130b is formed at the second conductive circuit 132 and adjacent to the first conductive via 124, and an opening direction of the opening portion 130b is far away from the first conductive via 124.

A partial structure of the second conductive circuit 132 which is adjacent to the second conductive via 134 is removed in the same way as described above to form the opening portion 130b, such that a distance between an inner edge (as indicated by referral numeral 130b in FIG. 5) of the opening portion 130b and the first conductive structure 120 is greater than a distance between the second conductive via 134 and the first conductive structure 120, which may prevent unexpected signal interference from occurring between the aforementioned partial structure of the second conductive circuit 132 and the first conductive structure 120.

To be more detailed, an inner edge (as indicated by referral numeral 130a in FIG. 5) of the opening 136a of the conductive layer 136 of the present embodiment, as illustrated in FIG. 5, is aligned with the inner edge (as indicated by referral numeral 130b in FIG. 5) of the opening portion 130b of the second conductive circuit 132. Namely, in comparison with the embodiment illustrated in FIG. 2A and FIG. 3, a partial structure of the conductive layer 136 which is adjacent to the second conductive via 134 is also removed, which may prevent unexpected signal interference from occurring between the aforementioned partial structure of the conductive layer 136 and the first conductive structure 120. It should be noted that as the inner edge of the opening 136a of the conductive layer 136 is aligned with the inner edge of the opening portion 130b of the second conductive circuit 132 as described above, what is indicated by referral number 136a in FIG. 6 represents not only a location of the inner edge of the opening, but also a location of the inner edge of the opening portion 130b.

In the present embodiment, the extending portion 130c and the opening portion 130b are respectively located at two opposite sides of the connection portion 122a of the first conductive circuit 122, such that the extending portion 130c and the opening portion 130b respectively correspond to different parts of a peripheral edge of the second conductive via 134. Thereby, the extending portion 130c is not removed due to the formation of the opening portion 130b, which may achieve the impedance control by using the extending portion 130c in the same way as described in the embodiments above while preventing the signal interference by using the opening portion 130b.

Figure 7:
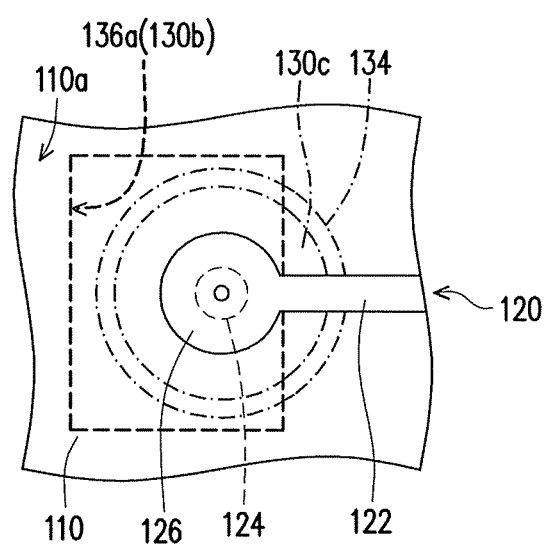
FIG. 7 is a schematic top view illustrating a circuit substrate according to another embodiment of the disclosure.

A shape of the opening portion 130b of the second conductive circuit 132 is not limited in the disclosure and may be a U-shape as illustrated in FIG. 6 or any other shape. An embodiment will be provided as an example with reference to a drawing for description below. FIG. 7 is a schematic top view illustrating a circuit substrate according to another embodiment of the disclosure. A shape of the opening portion 130b of the embodiment illustrated in FIG. 7 is not a U-shape, but a rectangular shape.

Based on the above, in the circuit substrate introduced by the disclosure, the extending portion is additionally disposed on the second conductive structure. With the extending portion, the distance between the second conductive structure and the bending portion of the first conductive structure can be adjusted, thereby adaptively controlling impedance at the bending portion to provide the circuit substrate with enhance impedance matching. Moreover, the opening portion with the opening direction far away from the first conductive via can be formed at the second conductive structure, so as to prevent unexpected signal interference from occurring between the second conductive structure and the first conductive structure.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A circuit substrate, comprising:
   a dielectric layer;
   a first conductive structure, comprising a first conductive circuit and a first conductive via, wherein the first conductive circuit is disposed on the dielectric layer, the first conductive via is disposed in the dielectric layer, and the first conductive circuit is connected to the first conductive via; and
   a second conductive structure, comprising a second conductive circuit and a second conductive via, wherein the second conductive circuit is disposed in the dielectric layer, the second conductive circuit and the first conductive circuit of the first conductive structure are arranged with an interval, and the second conductive via surrounds the first conductive via with an interval,
   wherein the second conductive structure has an extending portion, wherein the extending portion protrudes toward the first conductive via and does not contact the first conductive via.

2. The circuit substrate according to claim 1, wherein a connection portion of the first conductive via is connected to the first conductive circuit, and the extending portion is located directly below the first conductive circuit.

3. The circuit substrate according to claim 1, wherein the first conductive circuit is disposed on a surface of the dielectric layer, and an orthographic projection of the extending portion on the surface of the dielectric layer at least partially overlaps the first conductive circuit.

4. The circuit substrate according to claim 1, wherein the first conductive structure has a first corner portion, the first corner portion is formed at a junction of the first conductive circuit and the first conductive via, the second conductive structure has a second corner portion, the second corner portion is formed at a junction of the second conductive circuit and the second conductive via, and the extending portion extends from the second corner portion to the first corner portion.

5. The circuit substrate according to claim 1, wherein the second conductive structure has an opening portion, and the opening portion is formed at the second conductive circuit and adjacent to the first conductive via.

6. The circuit substrate according to claim 5, wherein the extending portion and the opening portion respectively correspond to different parts of a peripheral edge of the second conductive via.

7. The circuit substrate according to claim 1, wherein the second conductive structure comprises a conductive layer, the conductive layer is located on the second conductive circuit, and the extending portion extends from the conductive layer.

8. The circuit substrate according to claim 7, wherein the second conductive structure has an opening, the opening corresponds to the second conductive via, and the extending portion is formed in the opening.

9. The circuit substrate according to claim 1, wherein the second conductive structure comprises a conductive layer, and the extending portion extends from the conductive layer.

10. The circuit substrate according to claim 9, wherein the second conductive structure has an opening, the opening corresponds to the second conductive via, and the extending portion is formed in the opening.

11. The circuit substrate according to claim 1, comprising:
a pad, disposed on a surface of the dielectric layer and covering the first conductive via, and the first conductive circuit being connected to the first conductive via through the pad, wherein the pad does not overlap an orthographic projection of the extending portion of the second conductive structure on the surface of the dielectric layer.

12. A circuit substrate, comprising:
a dielectric layer;
a first conductive structure, comprising a first conductive circuit and a first conductive via, wherein the first conductive circuit is disposed on the dielectric layer, the first conductive via is disposed in the dielectric layer, and the first conductive circuit is connected to the first conductive via; and
a second conductive structure, comprising a second conductive circuit and a second conductive via, wherein the second conductive circuit is disposed in the dielectric layer, the second conductive circuit and the first conductive circuit of the first conductive structure are arranged with an interval, and the second conductive via surrounds the first conductive via with an interval,
wherein the second conductive structure has a corner opening portion between the second conductive circuit and the second conductive via, wherein the second conductive structure has an extending portion, and the extending portion protrudes toward the first conductive via and does not contact the first conductive via.

13. The circuit substrate according to claim 12, wherein a connection portion of the first conductive via is connected to the first conductive circuit, and the extending portion is located directly below the first conductive circuit.

14. The circuit substrate according to claim 12, wherein the first conductive circuit is disposed on a surface of the dielectric layer, and an orthographic projection of the extending portion on the surface of the dielectric layer at least partially overlaps the first conductive circuit.

15. The circuit substrate according to claim 12, wherein the first conductive structure has a first corner portion, the first corner portion is formed at a junction of the first conductive circuit and the first conductive via, the second conductive structure has a second corner portion, the second corner portion is formed at a junction of the second conductive circuit and the second conductive via, and the extending portion extends from the second corner portion to the first corner portion.

16. The circuit substrate according to claim 12, wherein the extending portion and the corner opening portion respectively correspond to different parts of a peripheral edge of the second conductive via.

17. The circuit substrate according to claim 12, wherein the second conductive structure comprises a conductive layer, the conductive layer is disposed on the second conductive circuit, and the extending portion extends from the conductive layer.

18. The circuit substrate according to claim 12, wherein the second conductive structure comprises a conductive layer, and the extending portion extends from the conductive layer.

19. The circuit substrate according to claim 12, wherein the corner opening portion is formed by removing a part of the second conductive circuit and is adjacent to the first conductive via.

20. The circuit substrate according to claim 12, comprising: a pad, disposed on a surface of the dielectric layer and covering the first conductive via, and the first conductive circuit being connected to the first conductive via through the pad, wherein the pad does not overlap an orthographic projection of the extending portion of the second conductive structure on the surface of the dielectric layer.

* * * * *